United States Patent
Glever et al.

(10) Patent No.: US 8,059,424 B2
(45) Date of Patent: Nov. 15, 2011

(54) ELECTRONIC BOARD INCORPORATING A HEATING RESISTOR

(75) Inventors: Bernard Glever, Nangis (FR); Daniel Goux, Les Molieres (FR); Robert Poirier, Taverny (FR)

(73) Assignee: Hispano Suiza, Colombes Cedex (FR)

( * ) Notice: Subject to any disclaimer, the term of this patent is extended or adjusted under 35 U.S.C. 154(b) by 960 days.

(21) Appl. No.: 12/022,505

(22) Filed: Jan. 30, 2008

(65) Prior Publication Data

US 2008/0187772 A1    Aug. 7, 2008

(30) Foreign Application Priority Data

Jan. 31, 2007    (FR) ...................................... 07 00684

(51) Int. Cl.
*H05K 7/06*        (2006.01)
*H05K 7/08*        (2006.01)
*H05K 1/18*        (2006.01)
*B23B 3/00*        (2006.01)
*B23K 1/18*        (2006.01)

(52) U.S. Cl. ........ 361/767; 361/760; 361/770; 174/260; 174/263; 228/203

(58) Field of Classification Search .............. 361/760, 361/767, 770; 428/576; 228/203; 174/260, 174/263
See application file for complete search history.

(56) References Cited

U.S. PATENT DOCUMENTS

| | | | |
|---|---|---|---|
| 4,769,525 A * | 9/1988 | Leatham | 219/209 |
| 4,788,404 A * | 11/1988 | Kent | 219/85.1 |
| 4,844,581 A * | 7/1989 | Turner | 385/91 |
| 5,010,233 A * | 4/1991 | Henschen et al. | 219/209 |
| 5,103,071 A * | 4/1992 | Henschen et al. | 219/85.22 |
| 5,483,270 A * | 1/1996 | Watanabe | 347/56 |
| 5,539,186 A * | 7/1996 | Abrami et al. | 219/548 |
| 6,031,729 A | 2/2000 | Berkely et al. | |
| 6,114,674 A * | 9/2000 | Baugh et al. | 219/543 |
| 6,184,494 B1 * | 2/2001 | Isokoski et al. | 219/209 |
| 6,396,706 B1 | 5/2002 | Wohlfarth | |
| 6,423,939 B1 * | 7/2002 | Pan | 219/209 |
| 6,492,620 B1 * | 12/2002 | Lau | 219/209 |
| 6,841,739 B2 * | 1/2005 | Moore | 174/255 |
| 6,911,624 B2 * | 6/2005 | Koopmans | 219/209 |
| 2004/0035840 A1 | 2/2004 | Koopmans | |
| 2005/0133574 A1 | 6/2005 | Glever et al. | |
| 2006/0200965 A1 | 9/2006 | Farooq et al. | |

FOREIGN PATENT DOCUMENTS

| | | |
|---|---|---|
| EP | 1 193 750 A2 | 4/2002 |
| FR | 2 864 419 | 6/2005 |

\* cited by examiner

*Primary Examiner* — Anatoly Vortman
(74) *Attorney, Agent, or Firm* — Oblon, Spivak, McClelland, Maier & Neustadt, L.L.P.

(57) ABSTRACT

An electronic board including an area forming a BGA type electronic component backing, and an electric heating resistor which supplies an amount of heat for soldering the component onto the plate is disclosed. The board includes a plurality of conductive layers alternating with electrically insulating layers, the resistor forming one of the conductive layers immediately underlying the surface layer. The board may also include a thermal drain. A facility for implementing the method is also disclosed. It allows for an electronic board to be repaired through replacing defective members without risking to unsolder or to damage adjacent members.

9 Claims, 2 Drawing Sheets

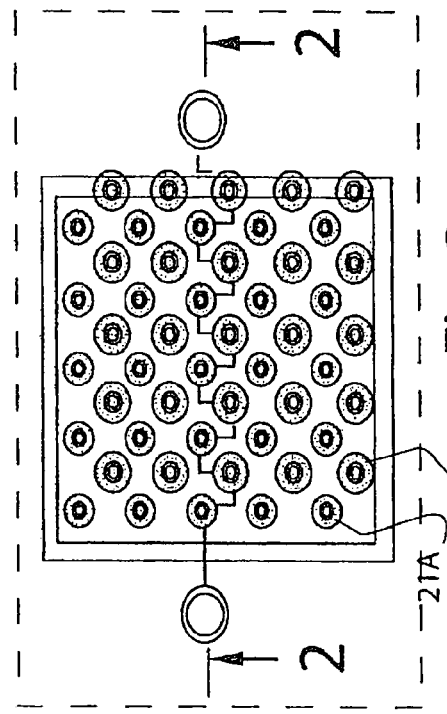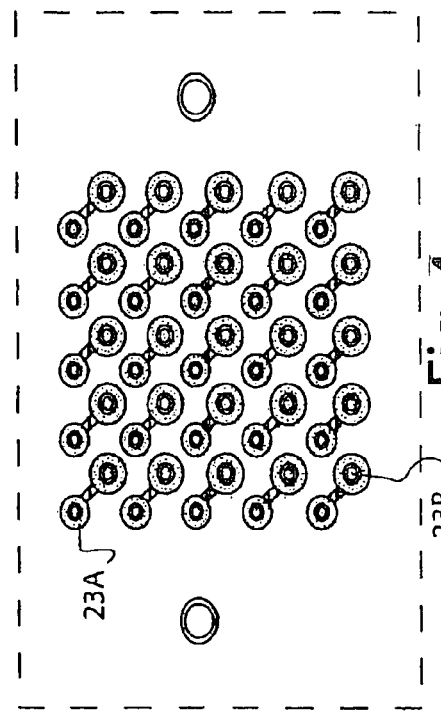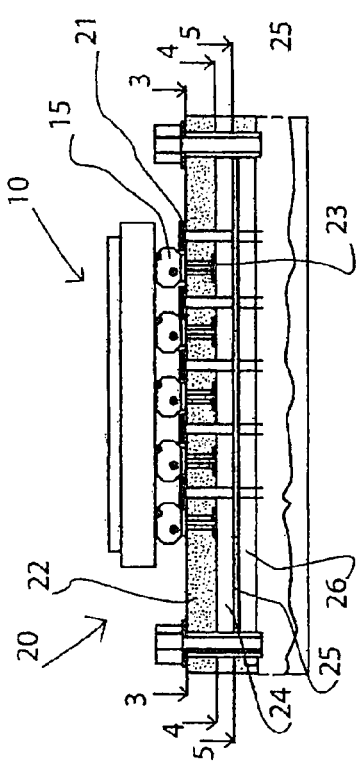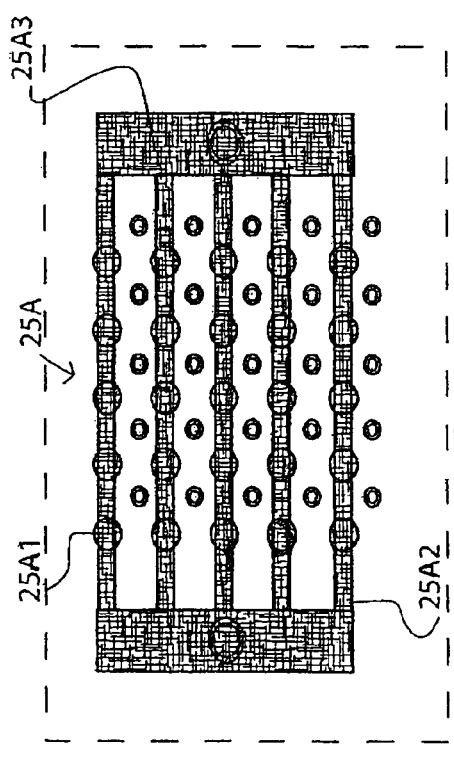

ELECTRONIC BOARD INCORPORATING A HEATING RESISTOR

BACKGROUND OF THE INVENTION

1. Field of the Invention

The present invention is related to the field of electronic boards and, in particular, to means for setting up and taking apart the components thereof through soldering.

2. Description of the Related Art

An electronic board comprises overall a planar backing, referred to as a printed circuit consisting in a stack of conductors, so-called layers, and separated one from another by electrical insulators. Electronic components are mounted on such a backing and the electrical connections are provided by metal tabs being soldered on plotting lands on the printed circuit. The backing is commonly referred to in the field by the acronym PCB (for printed circuit board).

Conventional components, being of the peripheral output type, i.e. having their connection tabs arranged on the periphery of the housing containing the electronic chip, can be easily soldered to the substrate. The heat required for the solder melting and the soldering operation could be implemented by bringing the source of heat closer to the peripheral tabs without any risk of damaging the component through excessive heating.

The technological development makes it now possible to use more compact components with so-called surface outputs. There is illustrated on FIG. 1 a diagram representing a component 10 of a type referred to in the field as BGA (ball grid array). The component comprises an electronic chip 11 embedded into an encapsulation material 12, and on the lower part a substrate 13. Plotting balls 15 are integral with the substrate on the other side and are arranged as a grid. Part of the balls 15A is electrically connected with the chip 11 through appropriate electrical connecting means 16A. Some balls 15B, located in the central part of the substrate, are electrically and thermally connected with the chip through connecting means 16B for draining the calories thereof from the housing to the PCB.

Compared to the components with peripheral outputs, surface output components have the inconvenience of requiring them to be heated to make them soldered, as the balls are not otherwise available. For soldering or unsoldering such components, it is therefore required to heat the housing at the melting temperature of the soldering alloy, such as 195° C. for lead based alloys. It should be ensured that the temperature remains lower than the chip holding temperature, which is 250° C.

Additionally, in some aeronautics applications, electronic boards are enclosed in housings in which no cooling air circulates. One or more metal foils functioning as thermal drains (generally made of copper) is/are inserted into the backing, referred to as the PCB, so as to be able to drain heat through conduction between the heating electronic component(s) and the outside of the metal housing containing the electronic boards. Furthermore, in particular for aeronautics applications, a weather resistant lacquer covers the whole board, and protects it against moisture.

Because of the high cost of electronic boards in some applications, for example aeronautics, it is important to be able to repair them by replacing the defective components. Replacing the defective components should occur without disturbing adjacent components. A difficult step involves locally providing a sufficient amount of heat for resulting in the soldering melting of the only component to be replaced.

The presence of the thermal drains and the weather resistant lacquer, in such a setting, is an inconvenience when it comes to replacing a BGA type component, i.e., to unsoldering and re-soldering it from its backing.

The prior art common solutions are not appropriate for soldering a new component or for unsoldering an existing component when the backing comprises thermal drains. In this case, it is necessary to provide a higher amount of heat for accounting for its removal through the drain. Such an increase in heat is detrimental to the adjacent components. Furthermore, the weather resistant lacquer is able to melt in turn at the heating temperature. It is likely to migrate into the adjacent solders and to damage electrical connections.

The Applicant have provided a solution in the Patent Application FR 2,864,419. Such a method for soldering an electronic component under repair on a backing comprising at least one thermal drain for said component, by means of a soldering paste incorporating a stripper flux activated at a first temperature, and a soldering alloy melting at a second temperature higher than the first one, comprises the following steps:

preheating the backing through the thermal drain up to said first temperature, positioning the component on the backing with the soldering paste, and heating the component by applying a hot gas at a high enough temperature for activating the flux and bringing the soldering alloy to the second temperature.

A soldering paste used in such a type of method commonly comprises a soldering alloy generally in the form of balls, a very light activating flux for processing surfaces, and a thinner or a solvent. Through heating across the thermal drain of the backing during the preheating operation, the heat supply is limited to the one required for activating the flux. The temperature of the backing and the adjacent components remain lower than that of the re-melting of the soldering alloy of the latter. Moreover, the heat required for the soldering alloy to reach the melting temperature is locally provided by the hot gas nozzle above the component. Preheating the board occurs through convection with a heating plate arranged under the board on the side opposite to the subject component.

Heating the component with hot air comprises a preheating step at an intermediate temperature, lower than the second temperature. The board is placed in an enclosure at least during the preheating step, allowing for the temperatures to be homogenized on the board. The hot gas is applied by means of a nozzle arranged perpendicularly to the plane of the board, associated with a gas return chimney forming means after the component has been swept.

In the above-noted Patent Application, there is also disclosed an assembling and repairing facility for electronic boards, for implementing the previous method(s), comprising a means for securing said board, a means for heating by thermal conduction on one side of the board and a means consisting in a heating plate for heating with hot gas on the other side of said board. Such a facility both provides for implementing the above described soldering method and for implementing the unsoldering of a component to be replaced without disturbing adjacent components.

The method is quite appropriate when the alloy to be used is based on lead as the tin lead alloy having the melting temperature able to be adjusted to 195° C. It is no longer adapted to soldering with an alloy not comprising lead, abiding to environmental regulations, and having its melting temperature higher and substantially closer to the limit temperature to which the component could withstand. Thus, an alloy such as made of tin, copper and silver, that satisfies regulation requirements, has a melting temperature of 230° C., higher by 35° C. than the above mentioned temperature, but essentially close to the 250° C. limit for the components.

BRIEF SUMMARY OF THE INVENTION

The invention has therefore the aim of allowing for solders to be used with a melting temperature higher than the temperature at which a BGA type component has been soldered until now on a printed circuit.

The invention has also the aim of improving the prior art method being the object of the above mentioned Patent Application. Such a technique furthermore provides for repairing electronic boards and for removing the component without creating any thermal stress on the board, able to damage part of the board. More particularly, the heat supply necessary for melting the soldering alloy of the component to be removed can be located without damaging the connections of the adjacent components or the components arranged under the backing.

According to this invention, such objectives are reached with an electronic board comprising a backing forming area of a BGA type component, and an electric heating resistor being able to supply an amount of heat for soldering the component onto the board, characterized in that said board additionally comprises a plurality of conductive layers alternating with electrically insulating layers, said resistor forming one of such conductive layers immediately underlying the surface layer.

Incorporating a heating resistor makes it possible to supply the required amount of complementary heat, for soldering with a material with a melting temperature higher than that of lead alloys, in the case of a board with a thermal drain. Soldering is performed through hot air heating on one side and supply of heat with a heating plate on the other side. The additional resistor makes it possible to limit the supply of heat to the soldering without affecting the electronic components. Although the interest of the solution is first observed for a board with a thermal drain, the addition of a heating resistor is also appropriate for the case of a board that does not comprise any thermal drain.

It is also to be noticed that the additional resistor here should not be mistaken for the heating resistors that are likely to comprise such electronic boards as used in aeronautics and having as a function do provide a sufficient amount of heat for the whole board so as to make possible a satisfactory operation thereof at very low temperatures.

According to another feature, said electronic component backing forming area comprises a plurality of wafers onto which the component is soldered, the heating resistor forming heating areas arranged under said wafers, preferably directly under the component.

The board of the invention is of particular interest in the field of the soldering/unsoldering method of a BGA type electronic component or any types of a component, the connection solders of which are inaccessible, comprising a first heating of the soldering from the opposite side of the board relative to the component, said heating resistor providing for a complementary supply of heat, for increasing the soldering temperature, for example up to the melting temperature.

More particularly, said solder heating from the opposite side is achieved through conduction by means of a heating plate.

According to another feature, the method comprises implementing a second heating by means of a hot gas applied onto the component.

BRIEF DESCRIPTION OF THE SEVERAL VIEWS OF THE DRAWINGS

This invention will now be described further in detail referring to the appending drawings, in which:

FIG. 2 illustrates, in a cross sectional view along line 2-2 of FIG. 3, part of an electronic board provided with a soldering linked component and with thermal drains in the backing, FIG. 3 schematically illustrates a sectional view along direction 3-3, of FIG. 2, FIG. 4 schematically illustrates a sectional view along direction 4-4, of FIG. 2, FIG. 5 schematically illustrates a sectional view along direction 5-5, of FIG. 2.

DETAILED DESCRIPTION OF THE INVENTION

Figure 1:
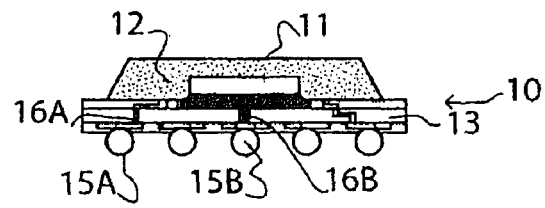
FIG. 1 illustrates, in a cross sectional view, the diagram of a surface output component.

On FIG. 2, there is partially illustrated an electronic board incorporating the means of the invention in the mounting area of the BGA electronic component. The board 20 comprises a plurality of electronic conductive layers 21, 23, 25, interposed between electrically insulating layers 22, 24, 26. Only the first three of each of them are illustrated here, but the board generally comprises a much higher number thereof. The first layer, 21, that is also illustrated on FIG. 3, comprises wafers 21A forming the electrical contacts with the component through the soldering balls 15. The wafers 21A are in electric contact with the contacts 23A of the underlying electronic layer 23 being illustrated on FIG. 4. The first layer also comprises wafers 21B and the layer 23, contacts 23B. Such wafers are mutually connected by metallized holes, providing for the implementation of electric interconnections of all the components wired on the external surfaces of the electronic board so as to provide for the electric functionality of the board The underlying layer 25 comprises a heating electric resistor 25A, according to the invention. There is illustrated on FIG. 5 the detail of the geometry of such an electric resistor. It has the shape of a grid with heating surfaces 25A1 connected by strands 25A2, themselves connected with two side strands 25A3. Both side strands 25A3 are electrically connected each to a metallized hole 27 and 27', respectively, crossing the board perpendicularly to its plane. The metallized holes 27 and 27' have as a function to make the connection of the resistor with an external electric source.

It can be seen that the heating surfaces are arranged with wafers 21A forming contacts on the first layer 21.

Figure 6:
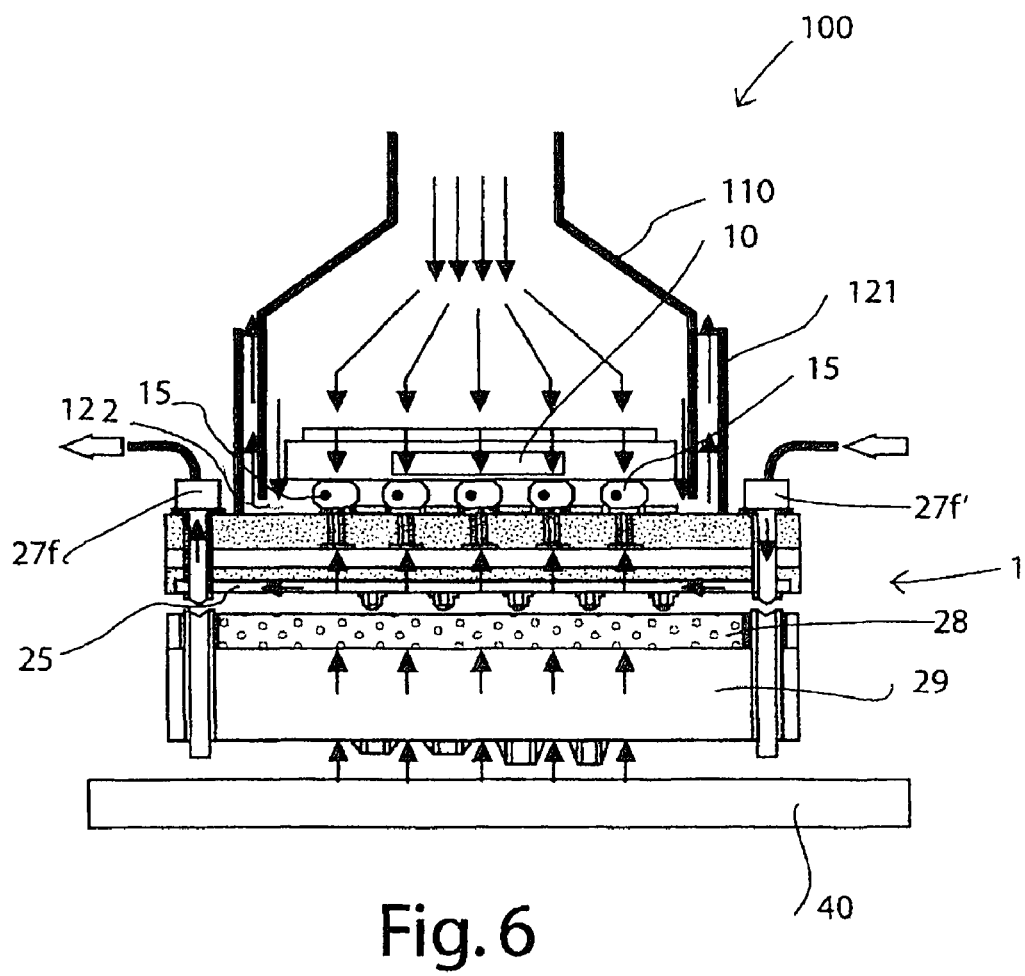
FIG. 6 illustrates a facility providing for the soldering of a BGA type electronic component onto a printed circuit board according to this invention.

Referring now to FIG. 6, there is shown an assembling and repairing facility 100 for electronic boards providing for soldering or unsoldering BGA type electronic components, wherein an electronic board 1 has been arranged with its backing area 20 on which the component 10 is arranged. With respect to FIG. 6, there is shown the thermal drain forming layer 28 and the base plate 29. The board further comprises a succession of not shown layers 25 comprising the heating resistor and the metallic thermal drain forming layer 28.

The facility comprises a heating plate 40 on which the board is positioned. Plugs 27f and 27f' are housed in the metallized holes 27 and 27'. Plugs are connected with an electric energy source.

The heating means of the plate 40 is not shown. It could be electric for example. On top of the board, there is arranged a nozzle 110 perpendicular to the plane of the backing. The width of the nozzle 110 is sufficient for covering the component 10. In FIG. 6, there are represented two wall members 121 external to the nozzle walls and parallel to the axis thereof providing for a passageway. They form a gas return chimney. Arrows indicate the direction of the incident gas as guided by the nozzle wall and of same gas after impinging against the component.

Advantageously, the board and heating plate assembly is enclosed in a thermal protective enclosure, here not shown, in order to achieve a good homogeneity in temperature of the various members it comprises.

Advantageously, the nozzle comprises two apertures 122 arranged at the locations where the components to be soldered or unsoldered are located, depending on whether a board is to be assembled or to be repaired by replacing a component thereof. Such apertures are clogged, for example, at locations where no intervention is needed. The members of the wall 121 are, for example, located along the edges of the aperture 122 so as to form a barrier to the gas when a heating nozzle is positioned through the aperture. The walls form a chimney with the walls of a nozzle being positioned in the aperture.

An exemplary soldering cycle of a specific component will now be described.

Preheating the plate is made by means of the heating plate 40; the heat produced by the plate is transmitted up to the metallic members forming the thermal drains of the board. The temperature increase is continued until the board reaches a defined temperature.

Afterwards, the component is positioned on the backing interposing the soldering paste. The temperature is sufficient for activating the stripper flux as contained in the soldering cream.

Hot air is blown through the nozzle on the component at a temperature ranging from 250° C. to 300° C. The air sweeps the upper surface of the component, bypasses the free edge of the nozzle and is guided by the chimney walls being deflected at 180° with respect to the initial direction. The temperature at the level of the balls of the component thereby progressively reaches 165° C. to 170° C.

The temperature of the hot air is then increased up to 400-490° C.

An amount of complementary heat is brought about by supplying the heating resistor 25A for a determined period of time, being sufficiently short for avoiding the adjacent components and the one to be soldered from being damaged. In so far as the heating surfaces are located at right angle to the wafers to be soldered, the risk of impairing the other components is further reduced; the temperature on the balls progressively increases up to 230° C. and that of the chip up to 230-240° C. The melting temperature of the alloy making up the soldering is reached. The hot air flow is stopped.

Upon repairing an electronic board, the procedure follows a similar cycle, or preferably, with the aim to simplify the operating modes, using the same cycle as that has been established for soldering the subject component. More particularly, the board is preheated up to the first temperature so that the strains as created in the board are balanced.

In the second case, the preheating temperature reaches with no difficulty the flux activation temperature. However, the temperature dispersion is substantially reduced at the various points on the board when the board is enclosed in a thermal protection enclosure.

The invention claimed is:

1. An electronic board comprising:
    an area forming a BGA type electronic component backing; and
    an electric heating resistor which supplies an amount of heat for soldering the component onto a plate,
    wherein the board comprises a plurality of conductive layers alternating with electrically insulating layers, said resistor forming one of the conductive layers immediately underlying the surface layer,
    wherein said area forming the electronic component backing comprises a plurality of wafers onto which the component is soldered, the heating resistor comprising heating surfaces arranged under said wafers, and
    wherein said heating resistor presents a shape of a grid with said heating surfaces connected by strands which are connected to two side strands.

2. A board according to claim 1, wherein the heating resistor comprises contacts for connecting the resistor to an external power supply.

3. A board according to claim 1, comprising a thermal drain.

4. A method for soldering/unsoldering a BGA type electronic component onto a printed circuit electronic board according to claim 1, comprising:
    a first heating of the soldering from the opposite face of the board relative to the component; and
    providing for a complementary heat supply using said heating resistor for a predetermined period of time for increasing the soldering temperature up to the melting temperature.

5. A method according to claim 4, wherein said soldering heating from the opposite face is reached through conduction by of a heating plate.

6. A method according to claim 5, further comprising a second heating by a hot gas applied onto the component prior to providing the complementary heat supply using said heating resistor.

7. A method according to claim 6, wherein the hot gas is guided by a bell comprising gas discharging means which discharges the hot gas after the hot gas is swept over said component.

8. A board according to claim 1, wherein the wafers form electrical contacts with the component through soldering balls.

9. A board according to claim 1, wherein the side strands are each electrically connected to a metalized hole which extends perpendicular through a thickness of the board.

* * * * *